(12) United States Patent
Park et al.

(10) Patent No.: US 7,031,192 B1
(45) Date of Patent: Apr. 18, 2006

(54) NON-VOLATILE SEMICONDUCTOR MEMORY AND DRIVING METHOD

(75) Inventors: Ki-Tae Park, Beacon, NY (US);
Tomoko Ogura, Hopewell Junction, NY (US)

(73) Assignee: Halo LSI, Inc., Hillsboro, OR (US)

( * ) Notice: Subject to any disclaimer, the term of this patent is extended or adjusted under 35 U.S.C. 154(b) by 122 days.

(21) Appl. No.: 10/704,437

(22) Filed: Nov. 7, 2003

Related U.S. Application Data (60) Provisional application No. 60/424,778, filed on Nov. 8, 2002.

(51) Int. Cl.
*G11C 5/02* (2006.01)

(52) U.S. Cl. .......................... 365/185.22; 365/185.18; 365/185.29; 365/185.24; 365/185.21; 365/185.17

(58) Field of Classification Search ........... 365/185.22, 365/185.18, 185.29, 185.24, 185.21, 185.17
See application file for complete search history.

(56) References Cited

U.S. PATENT DOCUMENTS

| | | | | |
|---|---|---|---|---|
| 4,434,478 A * | 2/1984 | Cook et al. | ............ | 365/185.01 |
| 5,768,193 A * | 6/1998 | Lee et al. | ............... | 365/185.25 |
| 6,009,015 A | 12/1999 | Sugiyama | ............... | 365/185.22 |
| 6,031,760 A | 2/2000 | Sakui et al. | ............ | 365/185.21 |
| 6,075,727 A | 6/2000 | Morton et al. | ......... | 365/185.22 |
| 6,248,633 B1 | 6/2001 | Ogura et al. | ................. | 438/267 |
| 6,333,867 B1 * | 12/2001 | Suzuki et al. | .................. | 365/63 |
| 6,507,514 B1 * | 1/2003 | Tsao et al. | ............. | 365/185.17 |
| 6,549,463 B1 | 4/2003 | Ogura et al. | ............ | 365/185.18 |
| 6,556,508 B1 * | 4/2003 | Tsao et al. | ................ | 365/238.5 |
| 6,636,438 B1 * | 10/2003 | Ogura et al. | ............ | 365/185.18 |
| 6,717,851 B1 * | 4/2004 | Mangan et al. | ........ | 365/185.11 |
| 6,738,289 B1 * | 5/2004 | Congwer et al. | ...... | 365/185.12 |
| 6,891,753 B1 * | 5/2005 | Cernea | .................. | 365/185.12 |
| 6,914,845 B1 * | 7/2005 | Ooishi | ........................ | 365/229 |

* cited by examiner

*Primary Examiner*—Viet Q. Nguyen
(74) *Attorney, Agent, or Firm*—George O. Saile; Stephen B. Ackerman (57) ABSTRACT

A data control unit is used to proved program, erase and verify signals to a non-volatile metal-oxide3-nitride-oxide-semiconductor (MONOS) memory. The data control unit comprises a plurality of sub-units that each contains a sense amplifier, two bi-directional flip-flop latches coupled in series and a program, erase and verify circuit. The two flip-flop latches each perform a task as a master latch or a slave latch depending on the memory operation. The program, erase and verify circuit in each sub-unit are connected together in a serial fashion such that multiple verification results are accumulated into one final result. Control signals are exchanged between a chip control unit and the data control unit to perform specified memory operations.

27 Claims, 5 Drawing Sheets

NON-VOLATILE SEMICONDUCTOR MEMORY AND DRIVING METHOD

This application claims priority to Provisional Patent Application Ser. No. 60/424,778, filed on Nov. 8, 2002, which is herein incorporated by reference.

BACKGROUND OF THE INVENTION

1. Field of Invention

The present invention relates to semiconductor memory and more specifically to non-volatile memory.

2. Description of Related Art

Data is stored as electrons in floating gates of non-volatile memory cells. In high density, low voltage and high-speed applications, a metal-oxide-nitride-oxide-semiconductor (MONOS) can be used where the floating gates are in the form of an oxide-nitride-oxide (ONO) composite layer located under a control gate. There are two separate and independently programmable ONO layers under a single control gate that provides a memory density improvement, as discussed in U.S. Pat. No. 6,549,463 (Ogura et al.). Electrons are stored separately under separate control in the two ONO layers so that two independent memory sites are located under a single control gate. This leads to an increase in storage density.

U.S. Pat. No. 6,248,633 (Ogura et al) is directed to the device structure and operation of a twin MONOS flash memory. In U.S. Pat. No. 6,075,727 (Morton et al.) a method is directed to writing and verifying bits in a non-volatile memory using a three-transistor memory cell. Data in a write latch is compared to data in a cell to determine if the cell has been programmed or erased. U.S. Pat. No. 6,031,760 (Sakui et al.) is directed to a non-volatile semiconductor memory, which includes sense amplifier circuits, each having a latch connected to the sense node. The sense amplifier contains first and second data-latching transistors that are used in a program and verify operation. U.S. Pat. No. 6,009,015 (Sugiyama) is directed to a program verify circuit for a nonvolatile memory array with multi-level stored data. The program verify circuitry contains a latch circuit connected between a bit line and a source/drain of a variable threshold transistor.

The prior art circuits described above are suitable for NAND flash applications in which all memory cells connected to a word line should be programmed at the same time. This simultaneous program is needed because the WL voltage during program is raised to a high voltage, e.g. 20V, creating a very high program disturb condition should there be any unselected cells. Thus, in a NAND flash, since every BL (or every other BL) requires a sense amplifier/verify circuit, the layout is a difficult space challenge, and the circuits must be small and simple.

A Twin MONOS cell and as well as additional kinds of split gate memory cells use the WL as a select gate, which does not require high voltage. So it is possible to selectively decode 1 in 2, 4, 8, etc cells such that several bit lines will share a single sense amplifier/data/verify circuit. Small area size is still important, but additional functionality can be easily included. Also, the sensing circuit itself can be made more sensitive so that sensing time can be reduced.

SUMMARY OF THE INVENTION

It is an objective of the present invention to provide a data control unit comprising a plurality of sub-units to control the program, read, verify and erase operations for a Metal-oxide-nitride-oxide-semiconductor (MONOS).

It is also an objective of the present invention for each sub-unit to comprise a bi-directional master flip-flop latch and a bi-directional slave flip-flop latch used transfer data between a sense amplifier coupled to bit line decoder and data input/output (I/O) lines connected to and I/O interface unit.

It is yet an objective of the present invention to couple the sub-units together in a serial fashion starting with the first sub-unit coupled to the second sub-unit and continuing to the next to last-sub-unit coupled to the last sub-unit.

It is still yet an objective of the present invention for each sub-unit to contain a sense amplifier, a first flip-flop latch, a second flip-flop latch and a program-erase-verify circuit.

It is further an objective of the present invention for the first and second flip-flop latches to be b-directional.

It is still further an objective of the present invention for the first flip-flop latch to perform as a master latch and the second flip-flop latch perform as a slave latch during a read operation, and the second flip-flop latch perform as a master latch and the first flip-flop latch perform as a slave latch during a program operation.

In the present invention a MONOS non-volatile memory array is coupled to and controlled by a control gate decoder, word line decoder, a bit line decoder. A memory chip control unit controls the operations of the decoders, a data control unit and an I/O interface unit. The data control unit interfaces between the bit line decoder and I/O data lines connected to the I/O interface unit, and comprises a plurality of sub-units, each further comprising a sense amplifier coupled to the bit line decoder, a first and second flip-flop latch coupled between the sense amplifier and the I/O data lines and a program-erase-verify circuit. Each sub-unit is connected in a serial fashion beginning with the program-erase-verify circuit of the first sub-unit coupled to the program-verify-erase-verify unit of the second sub-unit through to the program-erase-verify circuit of the next to last sub-unit coupled to the program-verify-erase-verify unit of the last sub-unit.

The first flip-flop latch performs as a master latch during a read operation receiving data from the bit line decoder while the second flip-flop latch performs as a slave latch during the read operation coupling data to the I/O interface unit. The second flip-flop latch performs as a master latch during a program operation receiving data from the I/O interface unit while the first flip-flop latch performs as a slave latch during the program operation coupling data to the sense amplifier. Data that is first placed into the master latch is coupled to the slave latch for further processing.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
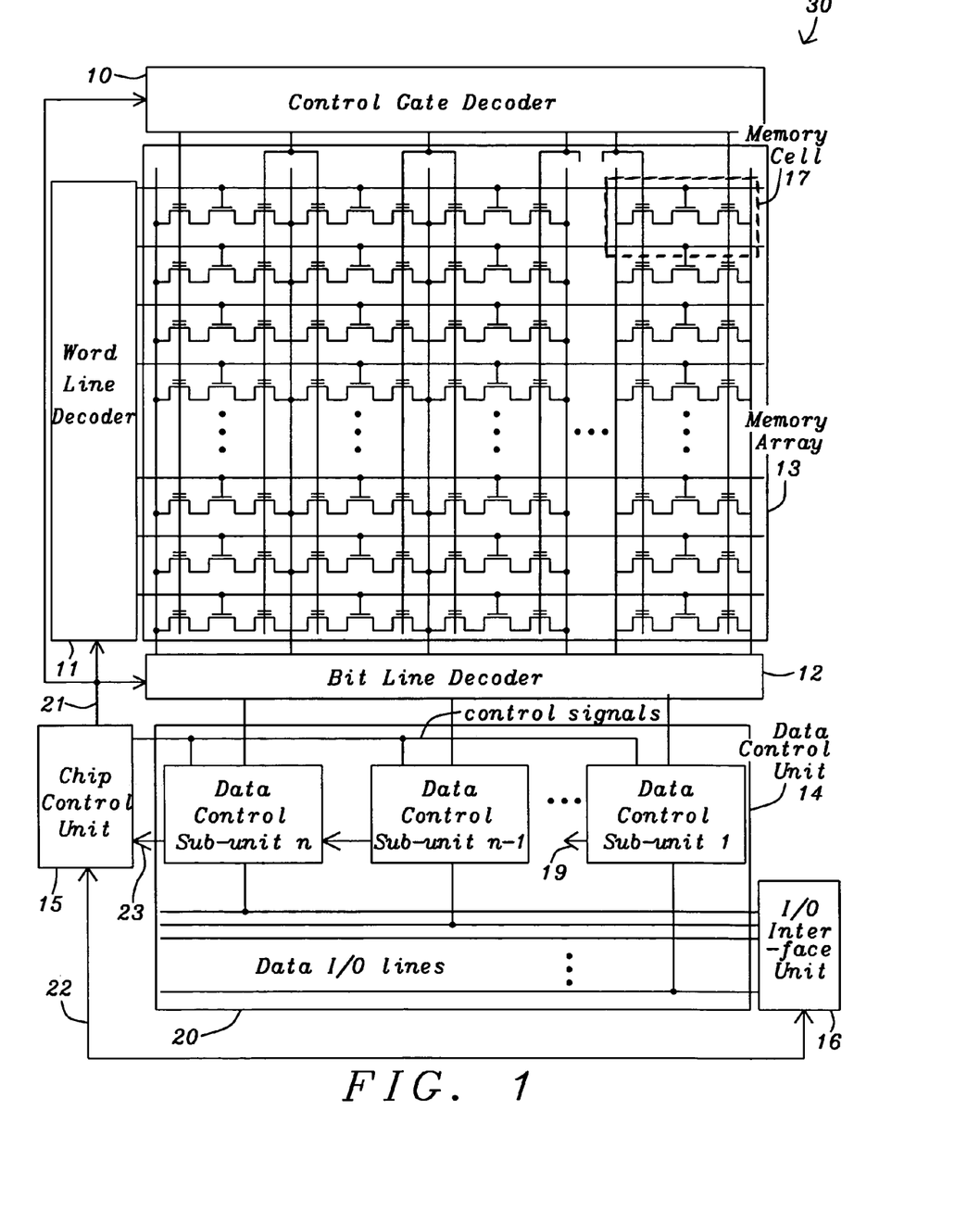
FIG. 1 is a block diagram of a memory device of the present invention.

FIG. 1 shows a schematic diagram of a non-volatile memory 30 of the present invention. A memory array 13 containing metal-oxide-nitride-oxide-semiconductor (MONOS) memory cells 17 is coupled to a control gate decoder 10, a word line decoder 11 and a bit line decoder 12. Interfacing between the bit line decoder 12 and an input/output (I/O) interface unit 16 is a data control unit 14. A memory chip control unit 15 controls the operation of the memory chip 30 and is coupled to the control gate decoder 10, the word line decoder 11, the bit line decoder 12, the data control unit 14 and the I/O interface unit. Contained within the data control unit 14 are a plurality of sub-units. Control signals are coupled to the sub-units from the chip control unit 15. A program-erase-verify signal 23 contained within the nth sub-unit is coupled from the nth sub-unit to the chip control unit 15. The plurality of sub-units are serially connected starting 19 with sub-unit 1 and continuing until sub-unit n−1 is coupled to sub-unit n. Each sub-unit of the data control unit 14 is coupled to the I/O interface unit 16 through data I/O lines 20.

Continuing to refer to FIG. 1, the chip control unit 15 delivers specified addresses to the control gate decoder 10, the word gate decoder 11, and the bit line decoder 12. The control gate decoder 10 is coupled to the control gates of the memory array, and during program, erase, and read operations the control gate decoder 10 selects a memory page in accordance with address supplied by the chip control unit 15. The chip control unit 15 supplies all control signals and high voltages required for the various memory operations. The word line decoder 11 is coupled to the word gates of the memory array, and during program, erase and read operations the word line 11 decoder selects a memory word line in accordance with address supplied by the chip control unit 15. The bit line decoder 12 is coupled to bit lines of the memory array, and during program, erase and read operations the bit line decoder 12 selects a memory bit line in accordance with address supplied by the chip control unit 15. The bit line decoder 12 couples data from the bit lines to the data control unit 14. The data control unit 14 senses and amplifies the bit line signals and transfers the amplified bit line signals to the I/O interface circuit 16 in a read operation.

Continuing to refer to FIG. 1, during a Program operation the data control unit 14 receives data from the I/O interface circuit and produces a program voltage or a program inhibit voltage depending upon the received data. After a program operation has been applied to a memory cell, the data control unit 14 senses and verifies the state of the selected memory cell. During an erase operation the data control unit 14 applies erase signals to the selected memory cells, after which the data control unit 14 reads the selected memory cells for the purpose of verifying the erase operation.

Figure 2:
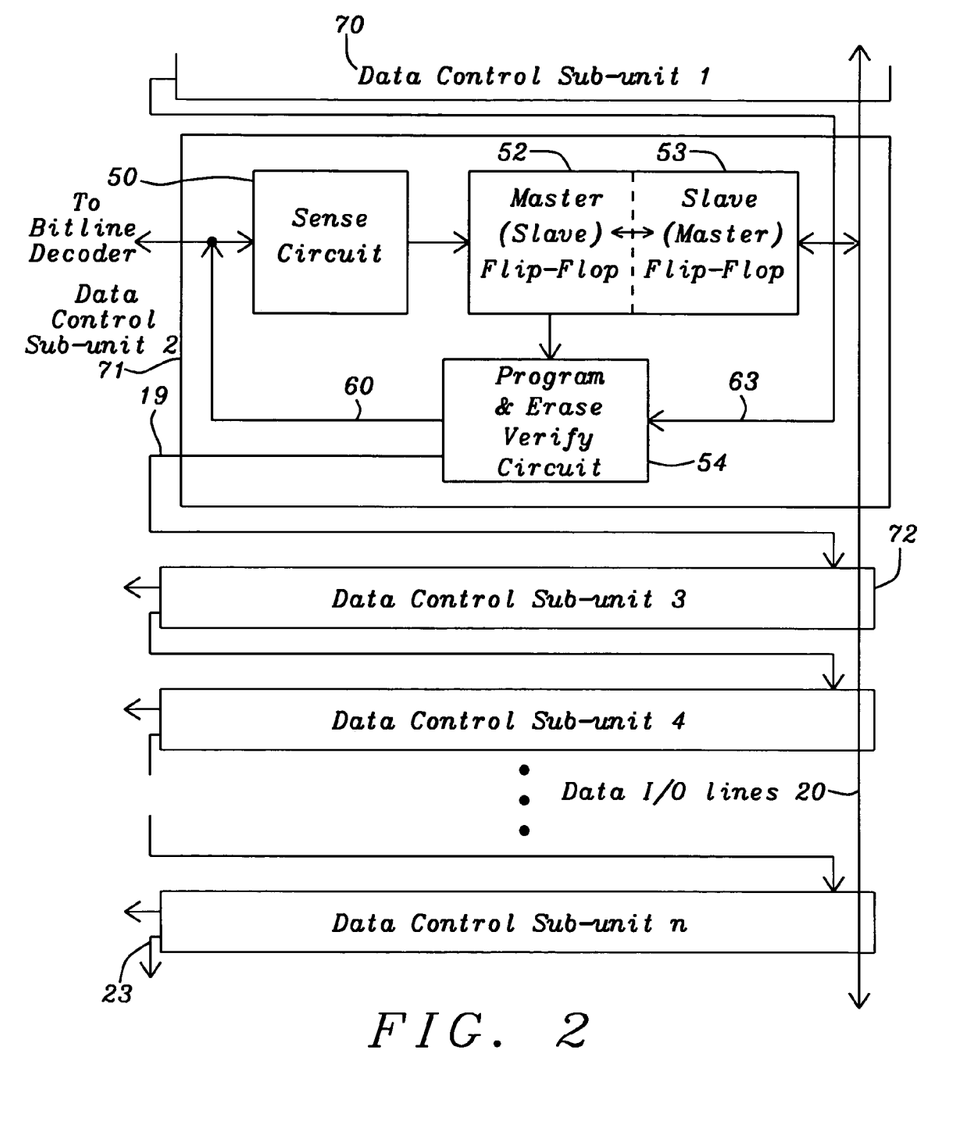
FIG. 2 is a block diagram of data control sub-units of the present invention.

In FIG. 2 is shown a block diagram of a data control sub-unit 71 within the data control unit 14 and connected to other sub-units 70 and 72. Within each sub-unit 71 is a sense amplifier 50, a first flip-flop latch 52, a second flip-flop latch 53 and a program-erase-verify circuit 54. The sense amplifier is coupled to the memory bit lines through the bit line decoder 12. The first flip-flop latch 52 coupled to the sense amplifier 50 acts as a master latch during a read operation and the second flip-flop latch 53 coupled to the first flip-flop latch 52 acts as a master latch during a program operation. During a read operation, the amplified signal the sense amplifier 50 is stored in the first flip-flop 52 latch, which is acting as a master latch. When the first flip-flop latch 52 is a master latch, data is transferred to the second flip-flop latch 53, which acts as a slave latch. During a program operation a signal from the data I/O lines 20 coupled to the data I/O unit 16 is stored in the second latch 53, which is acting as a master latch. Upon programming a selected memory cell, the sense amplifier 50 reads the program state of the selected cell and stores the amplified signal of the program state of the selected memory cell into the first flip-flop latch. It should be noted that the first flip-flop latch 52 has switched from being a slave latch during the preceding program operation to a master latch during the verify operation that is performing a read of the selected memory cell. The program-erase-verify circuit 54 reads the data of the verify operation from the first flip-flop latch 52 and produces a program condition voltage, or a program inhibit voltage, on a signal line 60 connected to the bit line decoder. The program condition voltage can be the voltage applied to the source BL in order to allow current to flow to the cell, this is usually a voltage close to 0V. The program inhibit voltage is any voltage applied to the BL that can prevent current from flowing to the cell. It can be any voltage greater than the word gate voltage minus the threshold voltage of the word gate, or simply VDD or VDD-Vt. When the second flip-flop latch 53 is a master latch, data is transferred to the first flip-flop latch 52, which acts as a slave latch. Both the first and second latches are bi-directional.

Continuing to refer to FIG. 2, during an erase operation the sense amplifier senses and amplifies a signal from the selected memory cell, which is outputted to the first flip-lop latch 52 acting as a master latch. The program-erase-verify circuit 54 reads the data stored in the first latch 52 and reads the output the data 63 from the previous sub-unit 70. The program-erase-verify circuit 54 then produces a combined verification result and outputs the combined verification result 19 to the next sub-unit 72. If either the results from the first latch or the previous sub-unit indicates that a cell has not been erased, then that result is passed on to the chip control unit 15. All cells must be erased before the signal passed to the chip control unit 15 from the nth sub-unit before the erase operation is completed. The chip control unit 15 (FIG. 1) receives the final verification 23 from the nth sub-unit. If all cells are verified to be erased, the erase operation is terminated; otherwise, additional erase operations are performed until the output of the nth sub-unit to the chip control unit shows that all memory cells have been erased.

Figure 3:
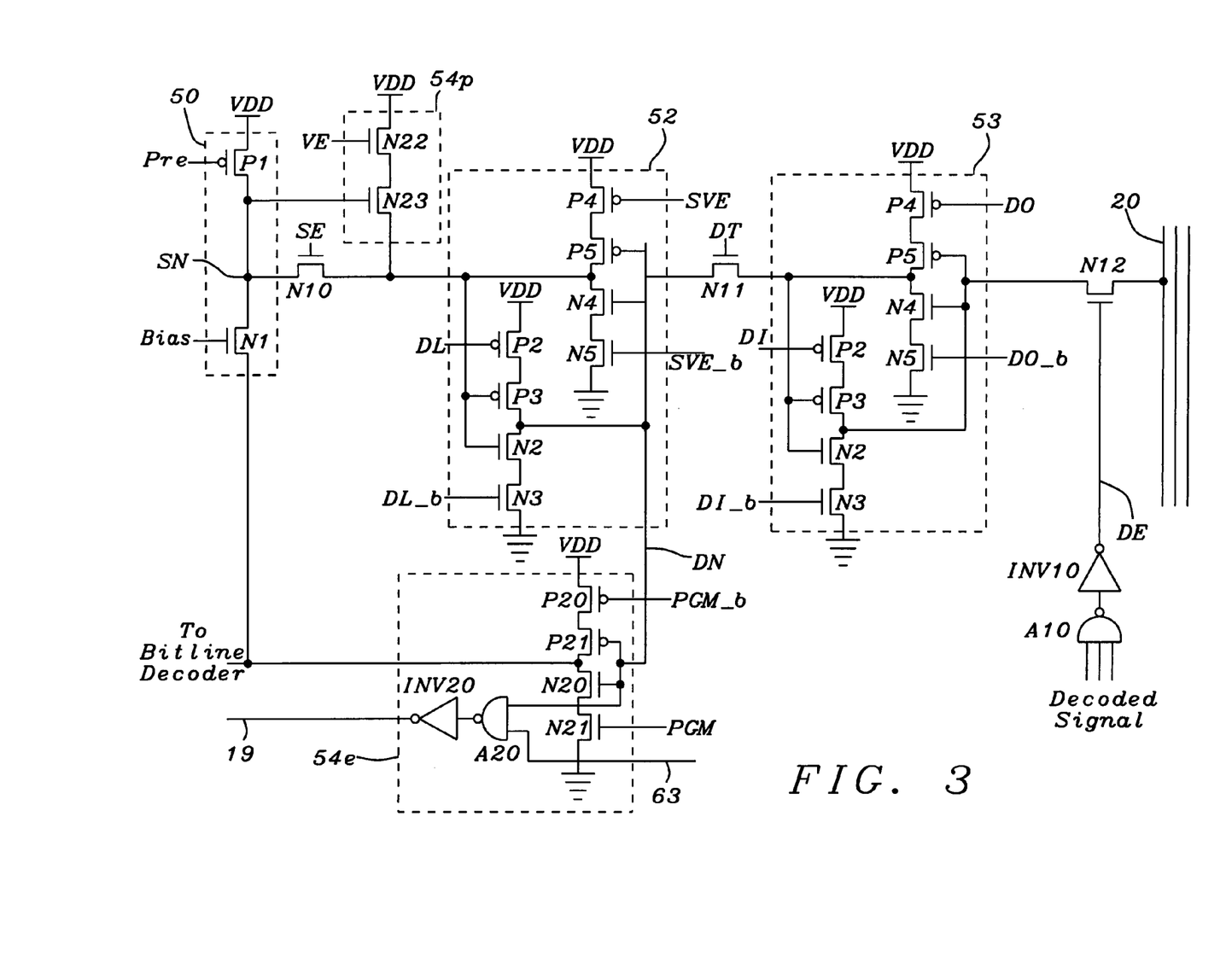
FIG. 3 is a circuit diagram of a data control sub-unit of the present invention.

In FIG. 3 is shown a schematic diagram of a data control sub-unit. The sense amplifier 50 comprises a PMOS transistor P1 and an NMOS transistor N1, which are controlled by signals "Pre" and "Bias" and is connected to the bit line decoder 12 through the NMOS transistor N1. "Pre" is the voltage used to control the precharge voltage of the BL through the source follower NMOS transistor. "Bias" is the voltage used to control the sensing signal margin. As a general rule, "Pre" is greater than "Bias". If 200 mV sensing margin is desired, then "Pre"−"Bias" is roughly 200 mV.

Continuing to refer to FIG. 3, the sense amplifier 50 is coupled to VDD as are other circuits within the sub-unit 71. It should be noted that a "P" indicates PMOS transistors and an "N" indicates NMOS transistors. Two clocked inverter latches are used for the first and the second flip-flop latch 52 and 53. The first flip-flop latch 52 comprises a first clocked inverter containing transistors P2, P3, N2, and N3 a second clocked inverter containing transistors P4, P5, N4 and N5. The first clocked inverter is clocked with DL and DL_b clock signals and the second clocked inverter is clocked with SVE and SVE_b clock signals. The second flip-flop latch 53 comprises a third clocked inverter containing transistors P6, P7, N6, N7 and a fourth clocked inverter containing transistors P8, P9, N8 and N9. The third clocked inverter is clocked with Dl and Dl_b clock signals and the fourth clocked inverter is clocked with DO and DO_b clock signals. The first and second flip-flop latches 52 and 53 are bi-directional where the output of one inverter contained within the latch is an input for the other inverter contained within the latch.

Continuing to refer to FIG. 3, the program-erase-verify circuit 54 is shown in two sections on FIG. 3, an erase verify circuit 54e and a program verify circuit 54p. A fifth clocked latch is contained within the program-erase-verify circuit 54e, which comprises transistors P20, P21, N20 and N21 and clocked with clock signals PGM and PGM_b. The output of the fifth clocked latch is coupled to the bit line decoder, and the input is coupled to the first flip flop latch 52 and an input of a NAND circuit A20. A second input 63 to the NAND circuit A20 is from the previous sub-unit 70. The output of the NAND circuit drives an inverter circuit INV20, and the output 19 of the inverter circuit INV20 couples to the following sub-unit 72 as shown in FIG. 2. The NAND A20 and the inverter circuit INV20 are used for the erase verify circuit. The program verify circuit 54p comprises two NMOS transistors N22 and N23. The gate of transistor N22 is driven by signal VE, and the gate of transistor N23 is connected to the sense node SN of the sense amplifier 50. The program verify circuit senses the BL signal in a verify operation. If the cell has been programmed, the latch resets and the program inhibit voltage (in this case VDD) is applied to the BL through the BL decoder.

Continuing to refer to FIG. 3, a transistor N10 couples the sense node SN of the sense amplifier 50 to the first flip-flop latch 52 under the control of signal SE. A transistor N11 couples the first flip-flop latch 52 to the second flip-flop latch 53 under the control of signal DT. A transistor N12, under the control of a decoded signal through a NAND circuit A10 and an Inverter circuit INV10 and with a gate signal DE, couples the second flip-flop latch to data I/O lines 20.

Figure 4:
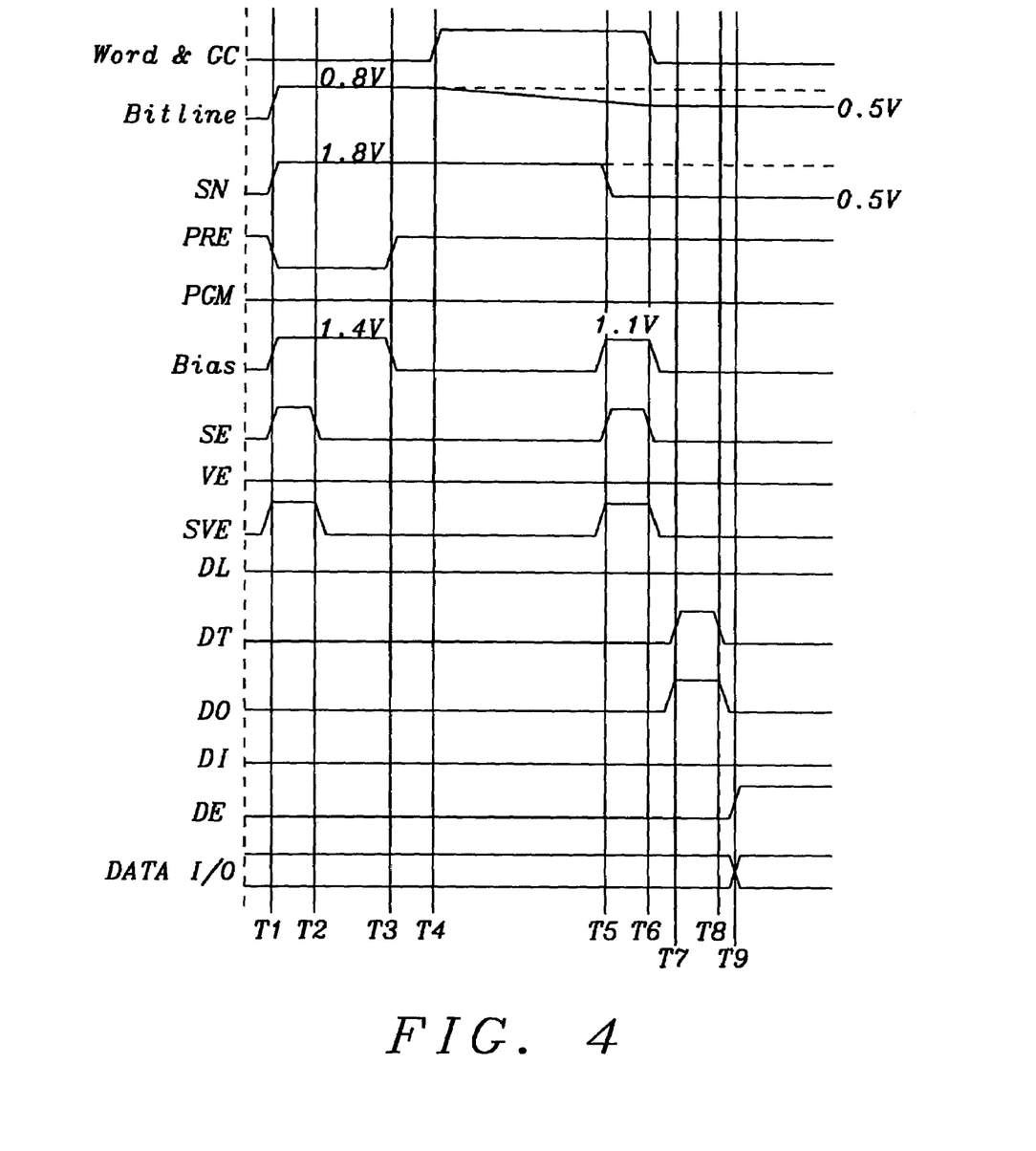
FIG. 4 is a signal diagram of a read operation of the present invention.

In FIG. 4 is shown a signal diagram of the present invention for a read operation. The read operation begins with by resetting the master flip-flop (the first flip-flop latch) and pre-charging the selected bit lines during the time T1–T3. At time T4 the control gate decoder 10 the word line decoder 11 are turned on by the signal shown on FIG. 4 as "Word & CG". Depending upon whether the selected cell is programmed or erased the bit line voltage "bit line" remains unchanged or begins to fall. At time T5 the "bias" signal is turned on along with the signal SE on the gate of the coupling transistor N10 and the clock SVE of the first flip-flop latch 52. The sense node SN remains the same or falls to lower voltage, 0.5V for example, depending on whether the selected cell has been programmed or is erased. At time T7 the coupling transistor N11 is turned on by signal DT and the data stored in the first flip-flop latch 52 is clocked (signal DO) into the second flip-flop latch 53. At time T9 the gate of the coupling transistor N12 is applied with a signal DE from a decoder signal through the NAND circuit A10 and the inverter circuit INV 10. The signal DE turns on transistor N12 coupling the read data in the second flip-flop latch 53 to the I/O data lines 20.

Figure 5:
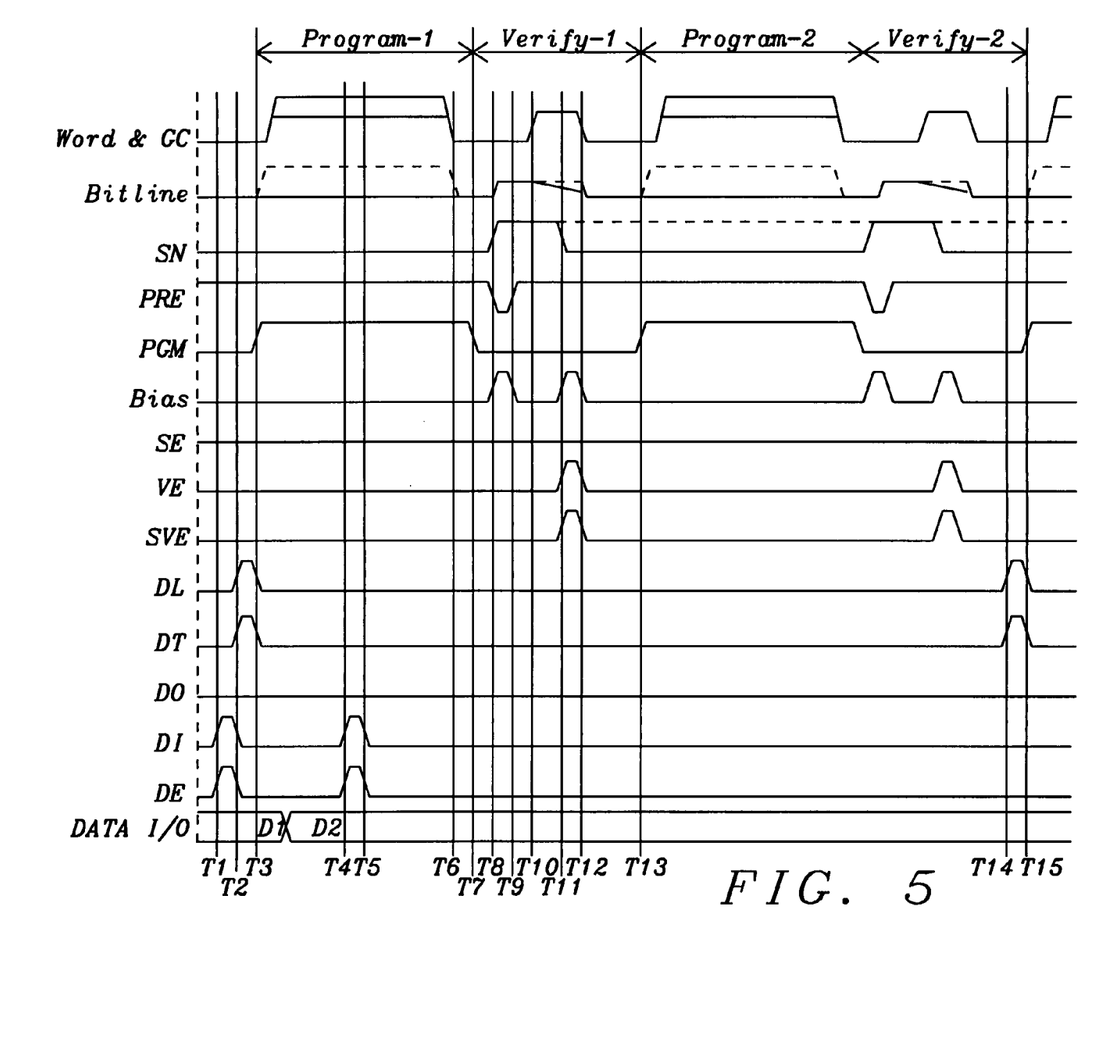
FIG. 5 is a signal diagram of a program and verify operation of the present invention.

In FIG. 5 is shown a signal diagram for a program and verify operation. A program operation begins by transferring data from the I/O interface circuit 16 at T1 time to the second flip-flop latch 53 designated as the master flip-flop during a program operation. The control signal DE connects the second flip-flop latch 53 to the data I/O lines and the clock signal Dl clocks the data into the second flip-flop latch 53 (master). At T2 time the data D1 is transferred to the first flip-flop latch 52 (slave) by transistor N11 controlled by signal DT and clocked into the first flip-flop latch 53 by clock signal DL. When the PGM control signal is turned on at T3, the program-erase-verify circuit 54e couples to the bit line decoder 12 a supply voltage VDD for program inhibit, or ground for programming the data stored in the first flip-flop latch 52. During the programming of a memory cell, the next data D2 is transferred from the I/O data lines to the second flip-flop latch 53 (master). After a program operation on the selected cell T7, program verification is performed starting at T8 similar to the read operation previously discussed, where the signals for the verify operation in FIG. 5 are similar to those of FIG. 4. When the signal of a selected memory cell is sensed, the verification control signal VE is turned on at T11 instead of the sense control signal SE that was used in the read operation. If the selected memory is programmed, the voltage of the data node DN of the first flip-flop latch 52 goes to a low voltage state and the program-erase-verify circuit 54e produces a supply voltage VDD that inhibits programming in the next program cycle. If the selected memory cell is not programmed, the voltage of data node DN remains in a high voltage state and the program-erase-verify circuit 54e produces a ground voltage to program the selected memory cell in the next program cycle starting at T13 and ending at T15 in the subsequent verify cycle.

After an erase operation is executed on a memory block verification is perform similarly to that of a read operation. If all data selected memory cell are erased, all data nodes DE of the first flip-flop latch circuit 52 are at a high voltage causing the program-erase-verify circuit 54e to producer a low voltage state indicating all selected memory cells are erased. If one of the memory cells is not completely erased, the data node DN will be at a low voltage and the output of the program-erase-verify circuit 54e will be at a high voltage state indicating that all the selected memory cells are erased.

While the invention has been particularly shown and described with reference to preferred embodiments thereof, it will be understood by those skilled in the art that various changes in form and details may be made without departing from the spirit and scope of the invention.

What is claimed is:

1. A non-volatile semiconductor memory, comprising:
   a) an array of non-volatile MONOS (metal-oxide-nitride-oxide-semiconductor) memory cells,
   b) a control gate decoder coupled to control gates of said memory cells,
   c) a word line decoder coupled to word lines of said memory array,
   d) a bit line decoder coupled to bit lines of said memory array,
   e) a data control unit coupled to said bit line decoder,
   f) an input/output (I/O) interface unit coupled to a plurality of I/O data lines from the data control unit,
   g) a chip control unit controlling said control gate decoder, the word line decoder, the bit line decoder, the data control unit and the I/O interface unit,
   h) said data control unit containing a plurality of sub-units serially coupled together and coupling a verify signal, starting with a first sub-unit coupled to a second sub-unit and ending with said chip control unit coupled to a last sub-unit whereby a program and erase verify signal is coupled to said chip control unit indicating program and erase operations completed, i) each said sub-unit providing an inhibit voltage to the bit line coupled to said each sub-unit to prevent further current from flowing to said memory cell connected to the bit line upon completion of program and erase operation on said memory cell.

2. The memory of claim 1, wherein each said sub-unit is connected between said bit line decoder and a data line of said plurality of I/O data lines.

3. The memory of claim 1, wherein said sub-units further comprise:
   a) a sense amplifier circuit,
   b) a first flip-flop latch connected to a second flip-flop latch,
   c) a program and erase verify circuit.

4. The memory of claim 3, wherein said first flip-flop latch is coupled to said sense amplifier circuit and to said program and erase verify circuit.

5. The memory of claim 3, wherein said second flip-flop latch is coupled to said I/O data line.

6. The memory of claim 3, wherein said program and erase verify circuit in a first sub-unit is coupled to said program and erase verify circuit in a second sub-unit, which is coupled to said program and erase verify circuit in a third sub-unit, and is further coupled in like manner to subsequent program and erase verify circuits and ending with said program and erase verify circuit in a next to last sub-unit coupled to said program and erase verify circuit in a last sub-unit, which is coupled to the chip control unit.

7. The memory of claim 3, wherein said first flip-flop latch, which is coupled to the sense amplifier, performs as a master latch and said second flip-flop latch performs as a slave latch during a read operation.

8. The memory of claim 3, wherein said first flip-flop latch, which is coupled to the sense amplifier, performs as a slave and said second flip-flop latch performs as a master latch during a program operation.

9. The memory of claim 3, wherein the first and second flip-flop latches comprise two clocked inverters coupled together that provide a bi-directional operation.

10. The memory of claim 1, wherein said non-volatile memory cells are twin MONOS flash memory cells.

11. A data control unit, comprising:
    a) a means for a data control unit in a non-volatile MONOS (metal-oxide-nitride-oxide-semiconductor) memory,
    b) a means for a plurality of data control sub-units within said data control unit, each data control sub-unit containing a sense amplifier, a first flip-flop latch, a second flip-flop latch connected in series and further connected to a program, erase and verify circuit,
    c) a means for data to be coupled between said data control unit and a bit line decoder,
    d) a means for said data to be coupled between said data control unit and an input/output (I/O) interface unit,
    e) a means for control data to be sent and received between said data control unit and a chip control unit,
    f) a means for control of memory program, erase and verify operations,
    g) a means for inhibiting program and erase operations on an individual bit line when program and erase operations completed for said individual bit line.

12. The data control unit of claim 11, wherein the means for a plurality of data control sub-units, further comprises:
    a) a means for said data control sub-units to be coupled together in a serial fashion to couple a program and erase verify signal from a first data control sub-unit connected to a second data control sub-unit and continuing to a last data control sub-unit which couples the program and erase verify signal to said chip control unit,
    b) a means for each said data control sub-unit to be coupled to said bit line decoder,
    c) a means for each said data control sub-unit to be coupled to an I/O data line that is connected to said I/O interface circuit.

13. The data control unit of claim 11, wherein said non-volatile memory is a twin MONOS memory.

14. The data control unit of claim 11, wherein said first and second flip-flop latches are connected together and wherein each flip-flop comprise two clocked inverter circuits and have bi-directional data means.

15. The data control unit of claim 13, wherein said first flip-flop latch performs as a master latch during a read operation.

16. The data control unit of claim 13, wherein said second flip-flop latch performs as a master latch during a program operation.

17. A method to program a non-volatile memory array, comprising:
    a) selecting a page within a non-volatile MONOS (metal-oxide-nitride-oxide-semiconductor) memory using a control gate decoder controlled by a chip control unit,
    b) selecting a word line within said non-volatile MONOS memory using a word gate decoder controlled by said chip control unit,
    c) selecting said page within said non-volatile MONOS memory using a bit line decoder controlled by said chip control unit,
    d) receiving data into a first and a second data control sub-unit from an input/output interface unit, where each data control sub-unit comprises a two stage latch wherein a first stage of said two stage latch is a master flip-flop latch and second stage of said two stage latch is a slave flip-flop latch,
    e) transferring said data from said master flip-flop latch to said slave flip-flop latch within each said data control sub-unit,
    f) producing a program voltage in accordance with said data to perform a program operation on a first memory cell connected to said first data control sub-unit and a second memory cell connected to said second data control sub-unit,
    g) coupling said program voltage to said first and said second memory cells selected by the control gate decoder, the word line decoder and the bit line decoder,
    h) creating a first program verify signal in said first data control sub-unit and a second program verify signal in said second data control sub-unit,
    i) coupling said first program verify signal to said second data control sub-unit when said first memory cell is programmed,
    j) combining said first program verify signal with said second program verify signal in said second data control sub-unit and coupling a combined said first and second verify signal to a third data control sub-unit until a last data sub-unit couples a final verify signal to said chip control unit.

18. The method of claim 17, wherein said program voltage is a program inhibit voltage for memory cells not being programmed.

19. The method of claim 17, wherein said non-volatile memory is a twin (MONOS) memory.

20. The method of claim 17, wherein said data is coupled to a sense amplifier by said slave flip-flop latch thereby causing the sense amplifier to couple a program voltage to said memory cell.

21. The method of claim 17, further comprising:
 a) sensing a voltage of the memory cell after the program operation,
 b) coupling said voltage to said master flip-flop latch,
 c) determining a program state of said memory cell with a verify circuit by reading said master flip-flop latch.

22. The method of claim 21, wherein said verify circuit creates a high voltage to prevent programming of the selected memory cell in the following programming cycle.

23. A method to read a non-volatile memory array, comprising:
 a) selecting a page within a non-volatile MONOS (metal-oxide-nitride-oxide-semiconductor) memory using a control gate decoder,
 b) selecting a word line within said non-volatile MONOS memory using a word gate decoder,
 c) selecting said page within said non-volatile MONOS memory using a bit line decoder,
 d) receiving data into a sense amplifier from a bit line of a selected cell,
 e) coupling said data from output of said sense amplifier to a two stage latch wherein a first stage of said two stage latch is a master flip-flop latch and a second stage of said two stage latch is a slave flip-flop latch,
 f) transferring said data from said master flip-flop latch to said slave flip-flop latch,
 g) coupling said data from said slave flip-flop latch to said data output/input (I/O).

24. The method of claim 23, wherein said non-volatile memory is a twin (MONOS) memory.

25. The method of claim 23, wherein said master flip-flop latch is reset and said bit line is precharged before a read operation begins.

26. The method of claim 22, wherein said bit line remains charged when the selected cell is programmed.

27. The method of claim 22, wherein said bit line is discharged dropping to a low voltage when the selected cell is erased.

* * * * *